US007799604B2

(12) United States Patent
Abe et al.

(10) Patent No.: US 7,799,604 B2
(45) Date of Patent: Sep. 21, 2010

(54) SEMICONDUCTOR DEVICE HAVING MULTILAYER PRINTED WIRING BOARD AND MANUFACTURING METHOD OF THE SAME

(75) Inventors: Tomoyuki Abe, Kawasaki (JP); Motoaki Tani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/822,084

(22) Filed: Jul. 2, 2007

(65) Prior Publication Data

US 2007/0257356 A1 Nov. 8, 2007

Related U.S. Application Data

(62) Division of application No. 11/023,044, filed on Dec. 28, 2004, now Pat. No. 7,400,035.

(30) Foreign Application Priority Data

Aug. 25, 2004 (JP) ............................ 2004-245511

(51) Int. Cl.
*H01L 21/44* (2006.01)

(52) U.S. Cl. ............... 438/107; 438/109; 257/E23.063; 257/E23.178; 257/E23.172; 216/13; 216/17; 216/18; 430/314; 430/317; 427/96.2; 427/97.1

(58) Field of Classification Search ......... 438/107–109, 438/622; 257/E23.063, E23.178, E23.172; 216/13, 17, 18, 19; 430/314, 317, 310; 427/96.2, 427/97.1, 98.8
See application file for complete search history.

(56) References Cited

U.S. PATENT DOCUMENTS 5,523,622 A 6/1996 Harada et al. ............... 257/734

(Continued)

FOREIGN PATENT DOCUMENTS

JP 5-226513 9/1993

(Continued)

OTHER PUBLICATIONS

S. Towle, et al.; "Bumpless Build-Up Layer Packaging;" ASME International Mechanical Engineering Congress and Exposition (IMECE); Nov. 11, 2001; (19 sheets.)/Discussed in the specification.
T. Shimoto, et al.; "High-Performance Flip-Chip BGA based on Multi-Layer Thin-Film Packaging Technology;" Proceedings of the 2002 IMAPS; Nov. 11, 2001; pp. 10-15 (6 Sheets.)/Discussed in the specification.

*Primary Examiner*—Hsien-ming Lee
(74) *Attorney, Agent, or Firm*—Kratz. Quintos & Hanson, LLP

(57) ABSTRACT

A semiconductor device includes a support body, a first substrate provided on a surface at one side of the support body, a second substrate provided on a surface at the other side of the support body, and a semiconductor chip provided on the first substrate exposed to an opening part piercing the support body and the second substrate. The first substrate includes a first dielectric layer and a wiring layer, a plurality of first electrodes connected to the semiconductor chip which first electrodes are provided on a first surface of the first substrate exposed to an inside of the opening part, and the second substrate includes a second dielectric layer made of a material substantially the same as the first dielectric layer.

7 Claims, 9 Drawing Sheets

U.S. PATENT DOCUMENTS

| | | | | |
|---|---|---|---|---|
| 6,324,067 | B1 | 11/2001 | Nishiyama | 361/761 |
| 6,759,740 | B2 | 7/2004 | Onitani et al. | 257/705 |
| 6,815,810 | B2 | 11/2004 | Takehara et al. | 257/687 |
| 6,873,529 | B2 | 3/2005 | Ikuta | 361/719 |
| 6,951,773 | B2 | 10/2005 | Ho et al. | 438/106 |
| 2002/0127769 | A1 | 9/2002 | Ma et al. | 438/106 |
| 2004/0041256 | A1 | 3/2004 | Takehara et al. | 257/712 |
| 2004/0227258 | A1 | 11/2004 | Nakatani | 257/787 |
| 2005/0001331 | A1 | 1/2005 | Kojima et al. | 257/778 |
| 2005/0006745 | A1 | 1/2005 | Nishimura | 257/686 |
| 2005/0051903 | A1 | 3/2005 | Ellsberry et al. | 257/777 |
| 2005/0056942 | A1 * | 3/2005 | Pogge et al. | 257/778 |
| 2005/0117312 | A1 | 6/2005 | Kimura et al. | 361/746 |
| 2005/0127489 | A1 | 6/2005 | Mallik et al. | 257/686 |
| 2005/0146854 | A1 | 7/2005 | Ikuta et al. | 361/719 |
| 2005/0151240 | A1 | 7/2005 | Takeda et al. | 257/700 |
| 2005/0157477 | A1 | 7/2005 | Kuramochi et al. | 361/761 |
| 2005/0161682 | A1 | 7/2005 | Mazzochette et al. | 257/79 |
| 2005/0207133 | A1 | 9/2005 | Pavier et al. | 361/761 |
| 2005/0211749 | A1 | 9/2005 | Hu et al. | 228/180.22 |
| 2005/0230797 | A1 | 10/2005 | Ho et al. | 257/678 |
| 2006/0049530 | A1 | 3/2006 | Hsu | 257/784 |

FOREIGN PATENT DOCUMENTS

| | | |
|---|---|---|
| JP | 2000-133745 | 5/2000 |
| JP | 2002-83893 | 3/2002 |

* cited by examiner

SEMICONDUCTOR DEVICE HAVING MULTILAYER PRINTED WIRING BOARD AND MANUFACTURING METHOD OF THE SAME

CROSS-REFERENCE TO RELATED APPLICATIONS

This application is a divisional application of prior application Ser. No. 11/023,044 filed on Dec. 28, 2004 now U.S. Pat. No. 7,400,035. This patent application is based upon and claims the benefit of priority from the prior Japanese Patent Application No. 2004-245511 filed on Aug. 25, 2004, the entire contents of which are hereby incorporated by reference.

BACKGROUND OF THE INVENTION

1. Field of the Invention

The present invention relates to a semiconductor device having a multilayer printed wiring board where a semiconductor chip is provided and a manufacturing method of the same.

2. Description of the Related Art

Recently and continuing, as performance and function of large scale integrated circuits (LSI) are becoming high, it is desired that mounting substrates have small size, high density and a large number of pins. A built-up multilayer substrate wherein wiring layers and dielectric layers are reciprocally stacked is being utilized as a high density mounting substrate.

The built-up multilayer substrate is formed by repeating processes for making multilayers, that is, repeating a process for forming a dielectric layer made of epoxy group resin on a glass epoxy substrate which is a core substrate and then a process for forming a via forming part piercing the dielectric layer and a wiring layer made of an internal layer conductive pattern.

As the speed implemented by the LSI is becoming high, it is required that a transfer speed between the LSIs be high and therefore a high frequency transfer property in the built-up multilayer substrate is required. In the built-up multi layer substrate, decoupling capacitors are provided around the LSI. The decoupling capacitor has a function to transiently flow an overcurrent generated at the time when a digital circuit of the LSI is being switched. By flowing the overcurrent, a state transition of a signal from "low" to "high" is implemented, and vice versa, so that a signal delay is suppressed. The decoupling capacitor also has a function to prevent energy of the over-current from being diffused into the whole of the substrate so as to prevent generation of noise due to the diffusion of the energy.

For example, in a semiconductor package of the related art, an opening part is provided at a metal core and an LSI chip is fixed to the opening part. In addition, a built-up multilayer substrate is provided on the surface of the metal core around the opening part. Under this structure, the chip and the built-up multilayer substrate are connected by a wire. See Japan Laid-Open Patent Publication No. 5-226513 and Japan Laid-Open Patent Publication No. 2000-133745.

In the case of the above-mentioned semiconductor package, the wiring length between the chip and the decoupling capacitor mounted on the built-up multilayer substrate is long and signal noise is generated. Furthermore, an inductance component generated at the wiring increases. A resonance circuit is formed by a capacity value of the decoupling capacitor and the inductance component and a resonant frequency is reduced. As a result of this, a high frequency transmission property is degraded.

To solve the above-mentioned problem, a semiconductor package 100 is suggested, as shown in FIG. 1, in the publication, "Bumpless Built-Up Layer Packaging", Gilroy J. Vandentop et. al., ASME International Mechanical Engineering Congress and Exposition (IMECE), Nov. 11, 2001. As shown in FIG. 1-(A), an LSI chip 101 is provisionally fixed to a film support body 107 by using an opening part 102*a* of a support substrate 102 and then fixed to the film support body 107 by resin 109. As shown in FIG. 1-(B), a built-up multilayer substrate 103 is formed on a surface at a side of electrodes 108 of the LSI chip 101 so that a decoupling capacitor 104 is mounted.

Furthermore, a semiconductor package 110 is suggested, as shown in FIG. 2, in the publication "High-Performance Flip-Chip BGA based on Multi-Layer Thin-Film Packaging Technology", T. Shimoto et. al., Proceedings of the 2002 IMAPS, p. 10-15. In the semiconductor package 110, a built-up multilayer substrate 112 is formed on a metal plate 111. After an LSI chip 101 is connected to the built-up multilayer substrate 112, the whole surface of the metal board 111 is removed.

However, in the semiconductor package 100 shown in FIG. 1-(B), the built-up multi layer substrate 103 is formed on the LSI chip 101 fixed to the opening part 102*a* of the support substrate 102. Therefore, disconnection between the electrodes 108 of the LSI chip 101 and the wiring layer 103*b* may be generated, due to a difference of the coefficient of thermal expansion between the LSI chip 101 and the dielectric layer 103*a*, by a heating process at the time when the dielectric layer 103*a* and the wiring layer 103*b* are stacked or solder bumps 105 or pins 106 are connected.

Furthermore, when the LSI chip 101 is fixed in the opening part 102*a*, the position of the LSI chip 101 varies widely against the opening part 102*a*. Therefore, it is difficult to position the wiring layer 103*b* to connect the electrodes 108 of the LSI chip 101. Furthermore, if the yield rate of the built-up multilayer substrate 103 itself is reduced, since it is difficult to reuse the LSI chip 101, the semiconductor chip may be useless and therefore manufacturing cost may be increased.

In addition, to make the semiconductor package 110 shown in FIG. 2, it is necessary to perform a process for removing the metal plate 111 after the LSI chip 1-1 is solder-connected to the built-up multilayer substrate 112. Therefore, the process may be complicated from the perspective of a control of a temperature condition or protection of the LSI chip 101. Furthermore, although a stiffener 114 is provided in the semiconductor package 110, a curve or winding, different from one at the time of fabrication of the built-up multilayer substrate 112, may be generated after the metal plate 111 is removed. Hence, it may be difficult to handle this at the time when the semiconductor package 110 is mounted.

SUMMARY OF THE INVENTION

Accordingly, it is a general object of the present invention to provide a novel and useful semiconductor device and manufacturing method of the same in which one or more of the problems described above are eliminated.

Another and more specific object of the present invention is to provide a semiconductor device by which a good high frequency transmission property and high reliability can be achieved and a manufacturing method of the same The above objects of the present invention are achieved by a semiconductor device, including:

a support body;

a first substrate provided on a surface at one side of the support body;

a second substrate provided on a surface at the other side of the support body; and a semiconductor chip provided on the first substrate exposed to an opening part piercing the support body and the second substrate;

wherein the first substrate includes a first dielectric layer and a wiring layer, a plurality of first electrodes connected to the semiconductor chip which first electrodes are provided on a first surface of the first substrate exposed to an inside of the opening part, and the second substrate includes a second dielectric layer made of a material substantially the same as the first dielectric layer.

According to the above-mentioned invention, the first substrate is provided on the surface at one side of the support body and the second substrate provided on the surface at the other side of the support body. In addition, the first dielectric layer is stacked at the first substrate and the second dielectric layer is stacked at the second substrate. Hence, even if there is a thermal expansion coefficient difference between the support body and the first and second substrates, it is possible to prevent a strain or curve due to the thermal expansion by putting the support body between the first substrate and the second substrate. Therefore, even when the semiconductor device is mounted and exposed at a high temperature, it is possible to prevent disconnection and bad connection due to the strain and curve. As a result of this, it is possible to realize a semiconductor device having high reliability.

The first substrate may have a plurality of second electrodes each connecting to a corresponding one of the first electrodes via the wiring, the second electrode may be situated on a second surface opposite to the first surface, and the semiconductor device may further includes a decoupling condenser connecting to the corresponding second electrode.

According to the above-mentioned invention, the semiconductor chip is connected to the first surface of the first substrate in the opening part of the support body. The second electrode connected to the decoupling condenser is provided on the second surface opposite to the first surface. Therefore, it is possible to connect the semiconductor chip and the decoupling capacitor in a state where the semiconductor chip is close to the decoupling capacitor. As a result of this, it is possible to achieve a higher transmission speed.

The above-mentioned object of the present invention is also achieved by a manufacturing method of a semiconductor device, including the steps of:

a) forming a first substrate on a first surface of a support body;

b) forming a second substrate on a second surface situated at a side opposite to the first surface;

c) forming a first opening part exposing a surface of the support body by piercing the second substrate;

d) forming a second opening part connecting to the first opening part and piercing the support body by using the second substrate as a mask; and e) solder-connecting a semiconductor chip to a surface of the first substrate in the second opening part;

wherein the step a) includes the processes of f) forming a first electrode connected to the semiconductor chip on the first surface of the support body;

g) reciprocally stacking a first dielectric layer covering the first electrode and a wiring layer; and h) forming a second electrode pattern on a surface of the first substrate; and wherein the step b) includes a process of i) stacking a second dielectric layer on the second surface.

According to the present invention, when the semiconductor chip is solder-connected to the surface of the first substrate, the support body is put between and fixed by the first substrate and the second substrate. Furthermore, the structure of the first substrate is substantially the same as the structure of the second substrate. Hence, it is possible to prevent a strain or curve due to a thermal expansion coefficient difference between the metal substrate and the first and second substrates. As a result of this, it is possible to easily connect the semiconductor chip and the first electrode and thereby reliability of the connection is improved.

Other objects, features, and advantages of the present invention will become more apparent from the following detailed description when read in conjunction with the accompanying drawings.

DETAILED DESCRIPTION OF THE PREFERRED EMBODIMENTS

A description is next given, with reference to FIG. 3 through FIG. 10, of embodiments of the present invention.

First Embodiment

Figure 1:
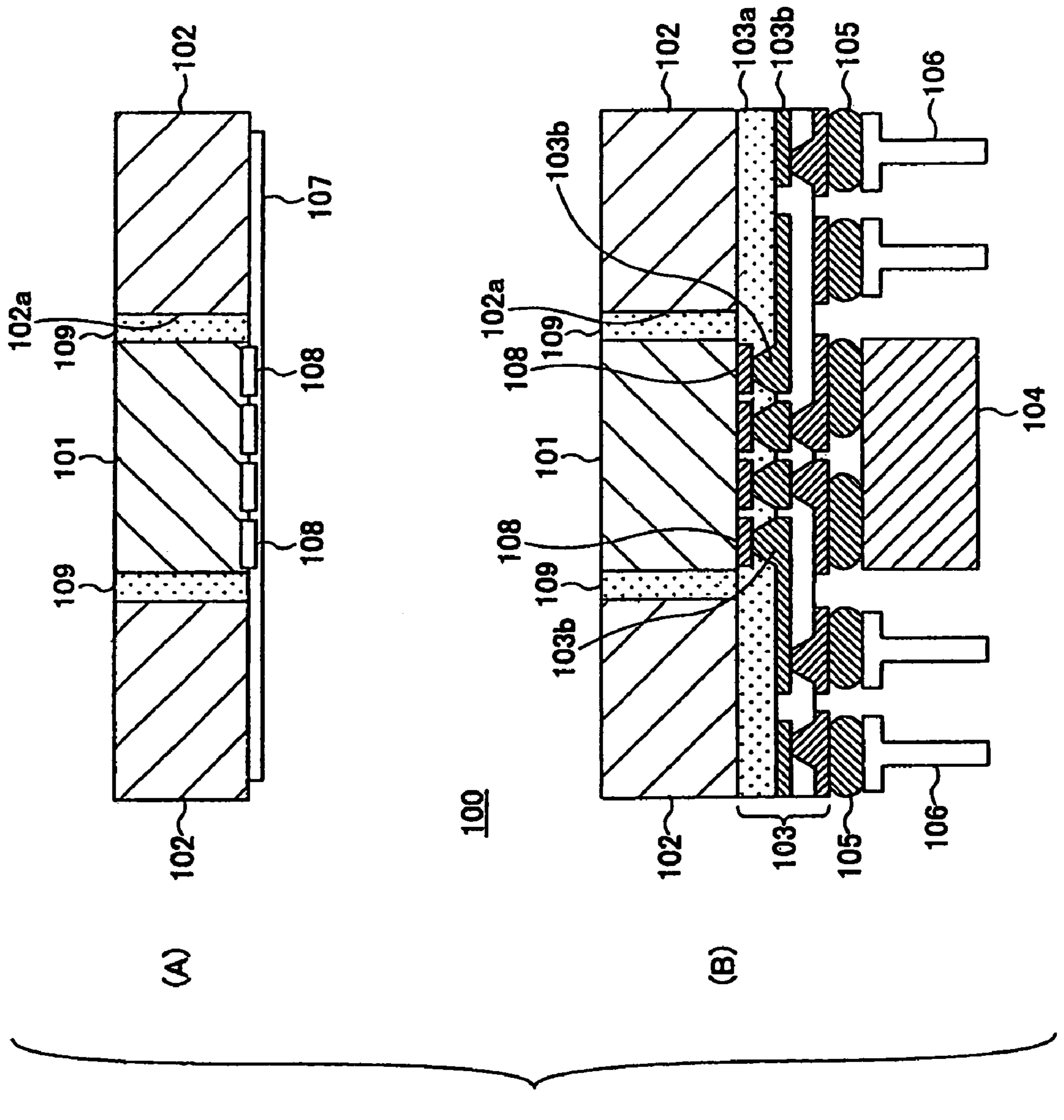
FIG. 1 is a cross-sectional view of a prior art semiconductor package.
Figure 2:
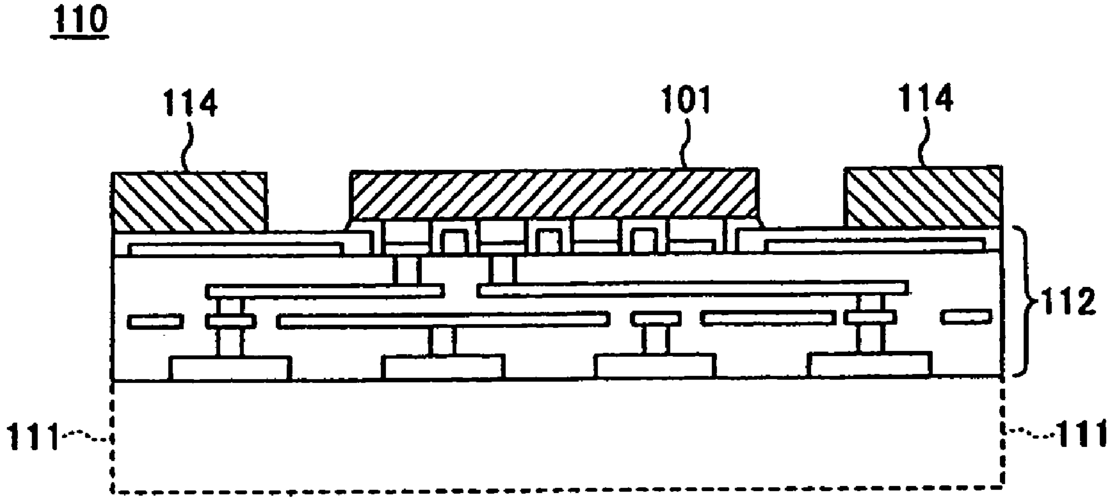
FIG. 2 is a cross-sectional view of another prior art semiconductor package.
Figure 2:
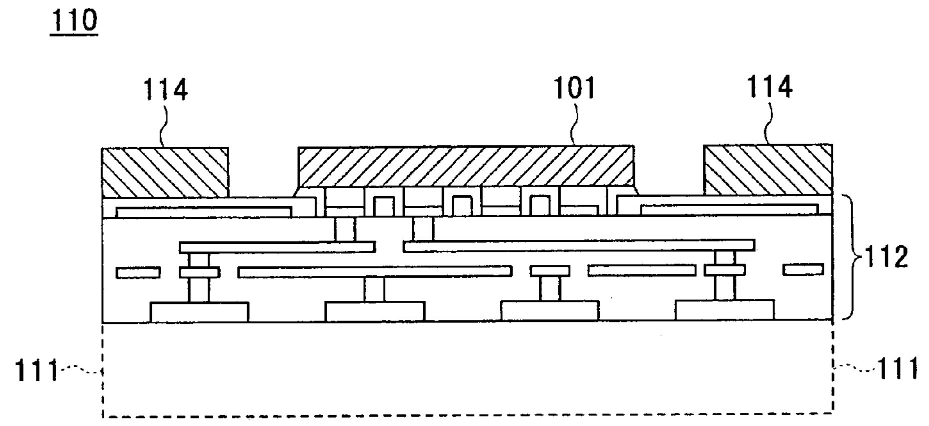
Figure 3:
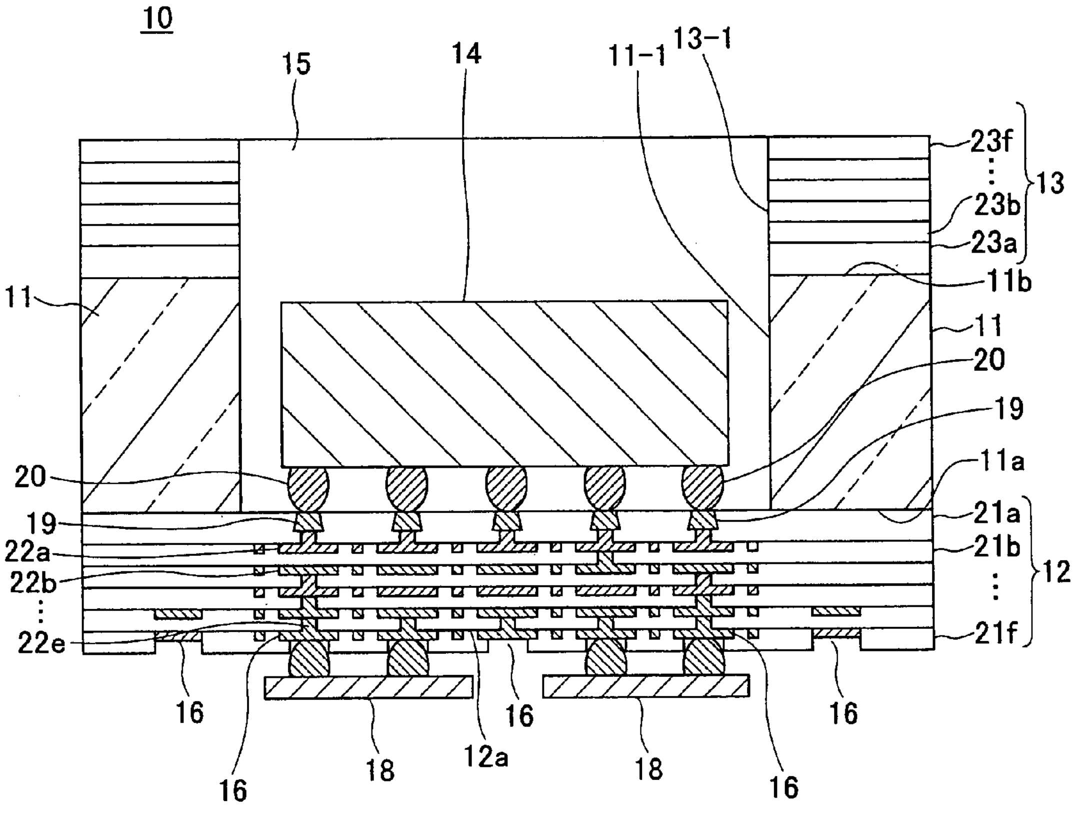
FIG. 3 is a schematic cross-sectional view of a semiconductor device of a first embodiment of the present invention.

FIG. 3 is a schematic cross-sectional view of a semiconductor device of a first embodiment of the present invention.

Referring to FIG. 3, the semiconductor device 10 of the first embodiment includes a support substrate 11, a multilayer wiring layer 12, a multilayer dielectric layer 13, a semiconductor chip 14, a resin part 15, a decoupling capacitor 18, and others. The multilayer wiring layer 12 is provided at a side of a first surface 11*a* of the support substrate 11. The multilayer dielectric layer 13 is provided at a side of a second surface 11*b* of the support substrate 11. The semiconductor chip 14 is provided at opening parts 11-1 and 13-1 that pierces the support substrate 11 and the multilayer dielectric layer 13. The resin part 15 covers the semiconductor chip 14 and fills the opening parts 11-1 and 13-1. The decoupling capacitor 18 is connected to an electrode pad 16 provided at a surface 12*a* of the multilayer wiring layer 12. The semiconductor chip 14 is connected to pads 19 for connecting via solder bumps 20. The pads 19 are formed on a surface of the multilayer wiring layer 12 in the opening part 11-1. The semiconductor chip 14 is electrically connected to the electrode pads 16 via the solder bumps 20, the pads 19 for connecting and a wiring of the multi layer wiring layer 12.

The support substrate 11 is made of plate material of, for example, Cu having a thickness of 500 μm, a Cu alloy, Fe, Ni, a Fe—Ni alloy, Mo or W. More specifically, 42 alloy (Ni (42%)—Fe(remaining)), Kover (Ni(29%)—Co(1.7%)—Fe (remaining)), Invar (Ni(36%)—Fe(remaining)), and stainless are used as the Fe—Ni alloy, or Cu/Invar/Cu, Cu/Kovar/Cu, Cu/Mo/Cu, or the like, is used as a clad metal, for the support substrate 11. From the perspective of thermal expansion in the heating process such as the solder connecting at the time when the semiconductor device 10 is mounted on the electronic substrate, it is preferable that a difference of the coefficient of thermal expansion between the support substrate 11 and the semiconductor chip 14 be small. Since the coefficient of thermal expansion of the semiconductor chip 14 is $3.5\times10^{-6}$/K, it is preferable that coefficient of thermal expansion of the support substrate 11 be set in a range from $-10\times10^{-6}$/K to $10\times10^{-6}$/K. W, Mo, Kovar, Invar or the like may be used as a material satisfying the above conditions.

It is preferable that the thickness of the support substrate 11 be set in a range from 100 μm to 1000 μm. If the thickness of the support substrate 11 is greater than 1000 μm, it takes a lot of time for etching. If the thickness of the support substrate 11 is less than 100 μm, the semiconductor device 10 may become curved.

The multilayer wiring layer 12 is formed by reciprocally stacking dielectric layers 21*a* through 21*f* and wiring layers 22*a* through 22*e* from a side of the support substrate 11. The dielectric layers 21*a* through 21*f* are made of epoxy resin and formed by laminating an epoxy resin sheet or applying the epoxy resin. Polyimide resin having a low dielectric constant, Bismaleimide-Triazine resin, or Maleimide-Styryl resin may be used as the dielectric layer 21 (21*a*-21*f*). By using such as resin, it is possible to prevent signal delay so that high speed transmission can be achieved.

The wiring layers 22*a* through 22*e* are made of a conductive material such as Cu, Cu alloy, Al or the like and formed by an electroless plating method, an electric plating method, a vacuum evaporation method, a spattering method, a CVD method or the like. The electroless plating method and the electric plating method are preferable from the perspective of easy forming of a thick film. A subtractive method, a semi-additive method, and a full-additive method may be used as a method for forming the wiring layers and patterning of wirings. In these methods, it is preferable that the semi-additive method be used from the perspective of forming a minute wiring pattern.

The pad 19 for connecting is formed on the surface of the multilayer wiring layer 12 in the opening part 11-1 of the support substrate 11. The pad 19 is made of Au film, Ni film, Pd film, Cu film Al film, and a stacking film thereof. The pad 19 is formed by adapting a position and a number of the solder bump 20 which is an input and output terminal of the semiconductor chip 14 discussed below.

An LSI chip where a micro processor unit (MPU), a micro controller unit (MCU), a digital signal processor (DSP), a memory circuit such as RAM or ROM, or the like, is installed, can be used as the semiconductor chip 14, for example. The solder bump 20 is fusion-bonded on a lower surface of the semiconductor chip 14 and connected to the pad 19 for connecting situated on a surface of the multiplayer wiring layer 12 in the opening part 11-1. The solder bump 20 is electrically connected to the electrode pad 16 via the wiring of the multilayer wiring layer 12.

The inside of the opening part 11 containing the semiconductor chip 14 is sealed by the resin part 15. The resin part 15 be made of, for example, epoxy group resin, polyimide group resin, bismaleimide group resin, or maleimide group resin. It is preferable that the resin part 15 is made of a material having a thermal expansion coefficient substantially the same as the semiconductor chip 14. By using this material, it is possible to reduce an internal stress applied to the semiconductor chip 14 by heating at the time when the semiconductor device 10 is mounted.

The multilayer dielectric layer 13 provided at an upper side of the support substrate 11 is made of the dielectric layers 23*a* through 23*f*. The dielectric layer 23 (23*a*-23*f*) is made of a material substantially the same as the material of the dielectric layer 21 of the multilayer wiring layer 12. It is preferable that the dielectric layer 23 be made of a material the same as the material of the dielectric layer 21 of the multilayer wiring layer 12. The difference of the thermal expansion coefficient between the multilayer dielectric layer 13 and the multi layer wiring layer 12 is thus reduced or made to have a value of substantially zero, so that a deformation generated at the time when the semiconductor device 10 mounted is reduced and a high reliable mounting can be achieved.

It is preferable that the number of layers of the dielectric layers 23*a* through 23*f* of the multilayer dielectric layer 13 be the same as the number of layers of the dielectric layers 21*a* through 21*f* of the multilayer wiring layer 12. In this case, the generation of the curve is further prevented if the support substrate 11 is expanded and contracted against the multilayer dielectric layer 13 and the multilayer wiring layer 12.

The decoupling capacitor 18 is connected to the electrode pad 16 and electrically connected to the semiconductor chip 14 via the wiring of the multilayer wiring layer 12. As the decoupling capacitor 18 which is inserted between the signal line and the ground line, a capacitor array (a product "LICA" (registered trademark) made by AVX company) having a high resonant frequency is used. Since the decoupling capacitor 18 having a capacity C is connected to the electrode pad 16 in a state where the decoupling capacitor 18 is close to the semiconductor chip 14, it is possible to reduce an inductance L between the semiconductor chip 14 and the decoupling capacitor 18 so that a resonant frequency being in proportion to $(L\times C)^{-1/2}$ can be made high. Other than the decoupling capacitor 18, if necessary, it is possible to connect an end line register between the electrode pad of the signal line and the electrode pad of the ground line. A dumping register may be connected to the signal line in series. In this case, it is possible to match the impedance of the signal line.

According to this embodiment, since the decoupling capacitor 18 is connected to the electrode pad 16 in a state where the decoupling capacitor 18 is close to the semiconductor chip 14 and a strain or curve of the semiconductor device 10 due to thermal expansion is prevented, in a case where the semiconductor device 10 is mounted or used in a high temperature situation, it is possible to prevent the generation of the disconnection between the semiconductor device 10 and the mounted substrate 11 or of the solder bumps 20 between the semiconductor chip 14 and the electrode pads 16. Therefore, it is possible to realize a semiconductor device with high reliability by which a high speed transmission can be achieved.

Next, a manufacturing method of a semiconductor device of this embodiment is discussed.

FIG. 4 through FIG. 7 are views for manufacturing of the semiconductor device of the first embodiment. In the process shown in FIG. 4-(A), a stacking body 32 is formed on a first surface 11*a* of the support substrate 11 made of a metal material. A part of the stacking body 32 becomes an electrode pad by the following process. More specifically, a photo resist film 31 is formed on the first surface of the support substrate 11 and a process for patterning is applied, so that the opening part 31-1 is formed. The opening part 31-1 has a columnar configuration, for example, and a diameter of 100 μm.

Next, the stacking body 32 is formed in the opening part 31*a* by the electric plating method. The stacking body 32 is formed by the Ni film 32*a* (having a film thickness of 5 μm, for example), the Au film 32*b* (having a film thickness of 1 μm, for example), the Ni film 32*c* (having a film thickness of 5 μm, for example), and the Cu film 32*d* (having a film thickness of 15 μm, for example). An adhesion between the Ni film 32*a* at the side of the support substrate 11 and the support substrate 11 is improved, and the Au film 32*b* functions as an etching stopper film in the process of the following chemical etching process.

Figure 4:
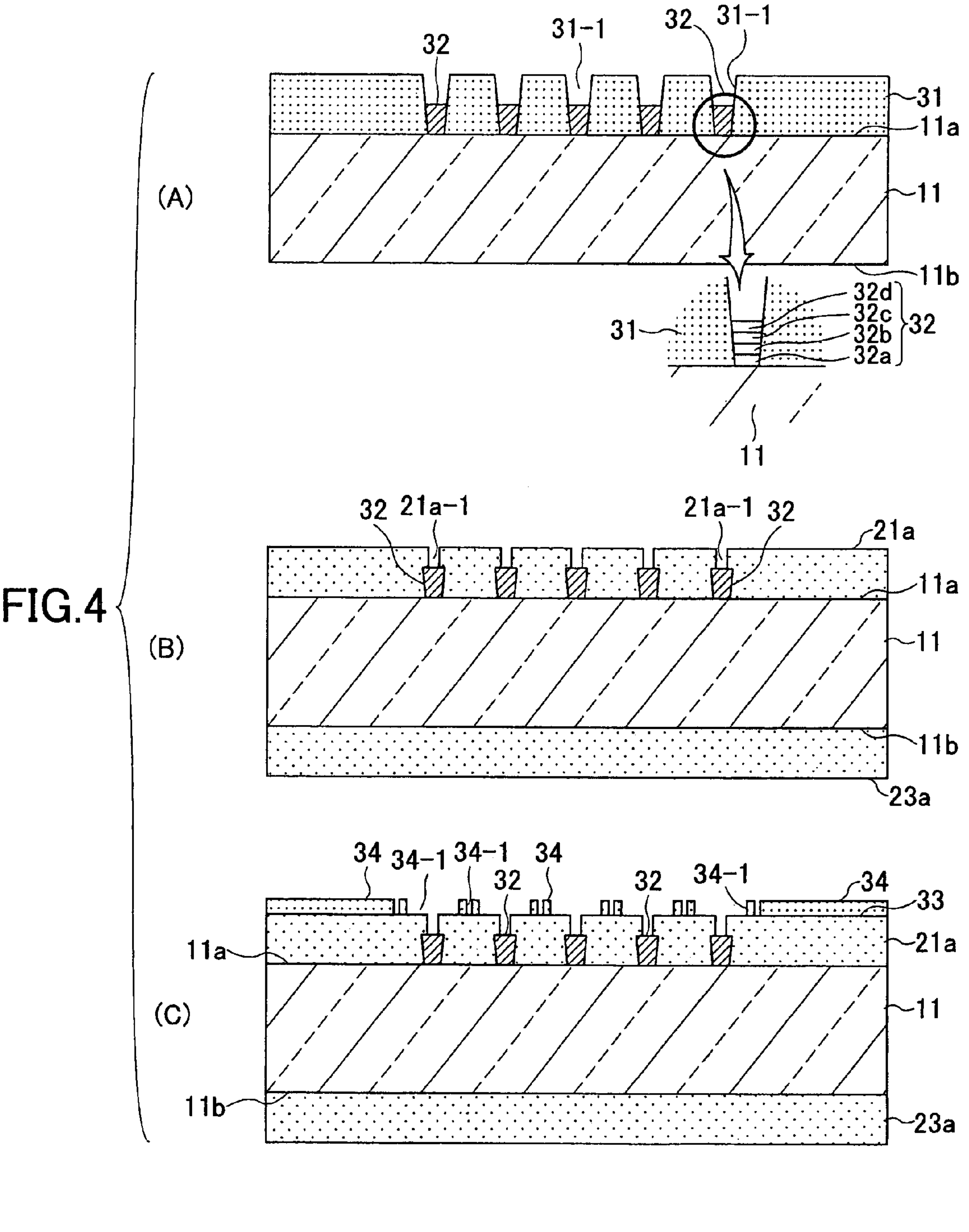
FIG. 4-(A) through FIG. 4-(C) is a first view for manufacturing of the semiconductor device of the first embodiment.

Next, in the process shown in FIG. 4-(B), the photo resist film 31 in the process shown in FIG. 4-(A) is removed so that the dielectric layer 21*a* is formed at the side of the first surface 11*a* of the support substrate 11 and the dielectric layer 23*a* is formed at the side of the second surface 11*b* of the support substrate 11. More specifically, an epoxy resin sheet having a thickness of 50 μm is applied on each of the first and second surfaces, a heating contact-bonding process is applied for a process time of 2 minutes, for example, at 130° C. by using a vacuum laminator, and a heating contact-bonding process is applied for a process time of 30 minutes, for example, at 170° C. by using a clean oven, so that the dielectric layers 21*a* and 23*a* are formed.

Furthermore, in the process shown in FIG. 4-(B), a via hole forming part 21*a*-1 is formed. The via hole forming part 21*a*-1 pierces the dielectric layer 21*a* situated at a side of the first surface 11*a* so that the surface of the stacked body 32 is exposed. More specifically, for example, the via hole forming part 21*a*-1 having a diameter of 60 μm is formed at the dielectric layer 21*a* by using a laser drilling machine which uses a carbon dioxide laser. And then, a de-smearing process is applied so that smear generated in the via hole forming part 21*a*-1 is removed by permanganate.

Next, in the process shown in FIG. 4-(C), a plating seed layer 33 made of a Cu film having a thickness of 0.5 μm, for example, is formed on a surface of the dielectric layer 21*a* at a side of the first surface 11*a* and in the via hole forming part 21*a*-1, by an electroless plating method.

Furthermore, in the process shown in FIG. 4-(C), a dry film photo resist 34 covering the plating seed layer 33 is stuck and an exposure process and a developing process are applied by using a mask of the wiring pattern, so that the opening part 34-1 of the wiring pattern is formed.

Figure 5:
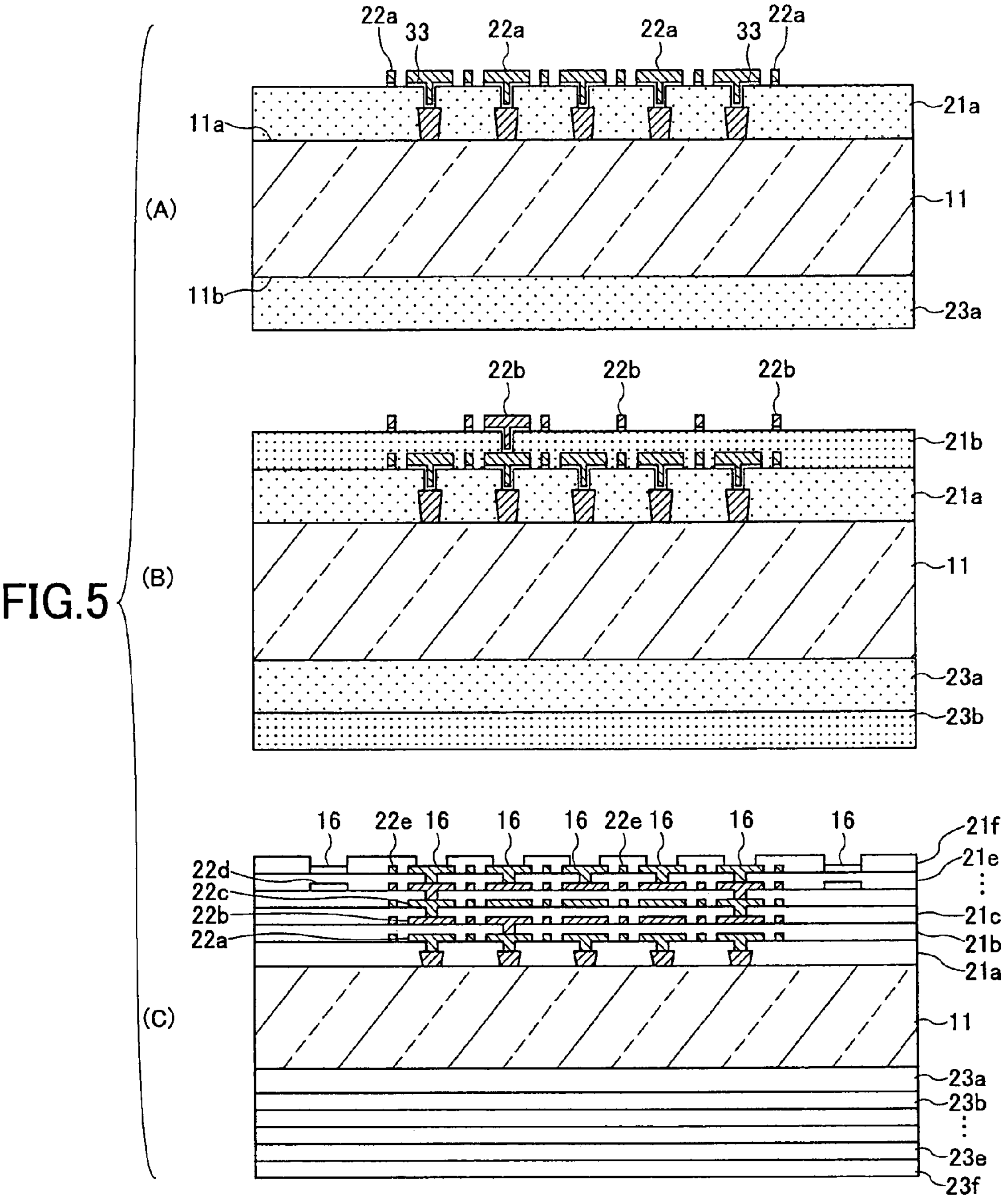
FIG. 5-(A) through FIG. 5-(C) is a second view for manufacturing of the semiconductor device of the first embodiment.

Next, in the process shown in FIG. 5-(A), a wiring layer 22*a* made of Cu film having a thickness of 20 μm, for example, is formed on the plating seed layer 33 by an electric plating method.

Furthermore, in the process shown in FIG. 5-(A), the dry film photo resist 34 is peeled out and then the exposed seed layer 33 is etched by using an etching liquid belonging to a mixture group of sulfuric acid and hydrogen peroxide water. And then, a heating process is applied by using a clean oven for a process time of 30 minutes at 170° C.

Next, in the process shown in FIG. 5-(B), epoxy resin sheets having a thickness of 50 μm are stuck on surfaces of the structure body shown in FIG. 5-(A), namely on a surface of the dielectric layer 21*a* at a side of the first surface 11*a* and a surface of the dielectric layer 23*a* at a side of the second surface, by using the same process as the process shown in FIG. 4-(B), so that the dielectric layers 21*b* and 23*b* are formed. Then, the wiring layer 22*a* is formed as well as the first wiring layer in the processes shown in FIG. 4-(B) through FIG. 5-(A).

Next, in the process shown in FIG. 5-(C), the process shown in FIG. 5-(B) is repeated so that the dielectric layers 21*c* through 21*e* and the wiring layers 22*c* through 22*e* are formed at a side of the first surface 11*a*. The dielectric layers 23*c* through 23*e* are formed at a side of the second surface 12*a*. The electrode pads 16 are formed at the same time that the wiring layer 22*e* situated at the outermost surface is formed.

Furthermore, in the process shown in FIG. 5-(C), pre-processing for the solder resist such as buffing process is applied to the wiring layer 22*e* situated at the outermost surface and the surface of the electrode pads 16, and then the solder resist 21*f* is formed. The solder resist is formed by a screen printing method, for example. The electrode is exposed by the exposure process and developing process and cured by the heating process.

Furthermore, in the process shown in FIG. 5-(C), the dielectric layer 23*f* is formed on the surface of the dielectric layer 23*e* at the side of the second surface. The dielectric layer 23*f* may be formed by sticking the epoxy resin sheet or curing the solder resist. By using the solder resist the same as one used at the side of the first surface, it is possible to have a thermal expansion coefficient substantially the same as the multilayer dielectric layer 13. In a case where the solder resist is formed, the heating process is applied to the electrode at the same time that it is being applied to the side of the first surface.

Furthermore, in the process shown in FIG. 5-(C), an Ni film having a film thickness of 5 μm and an Au film having a film thickness of 0.1 μm are formed on the surface of the electrode pads 16 by the electroless plating method (not shown in drawings due to thin film). Please note the structure in FIG. 6-(A) through FIG. 7 is shown upside down as compared with the structure in previous drawings.

Figure 6:
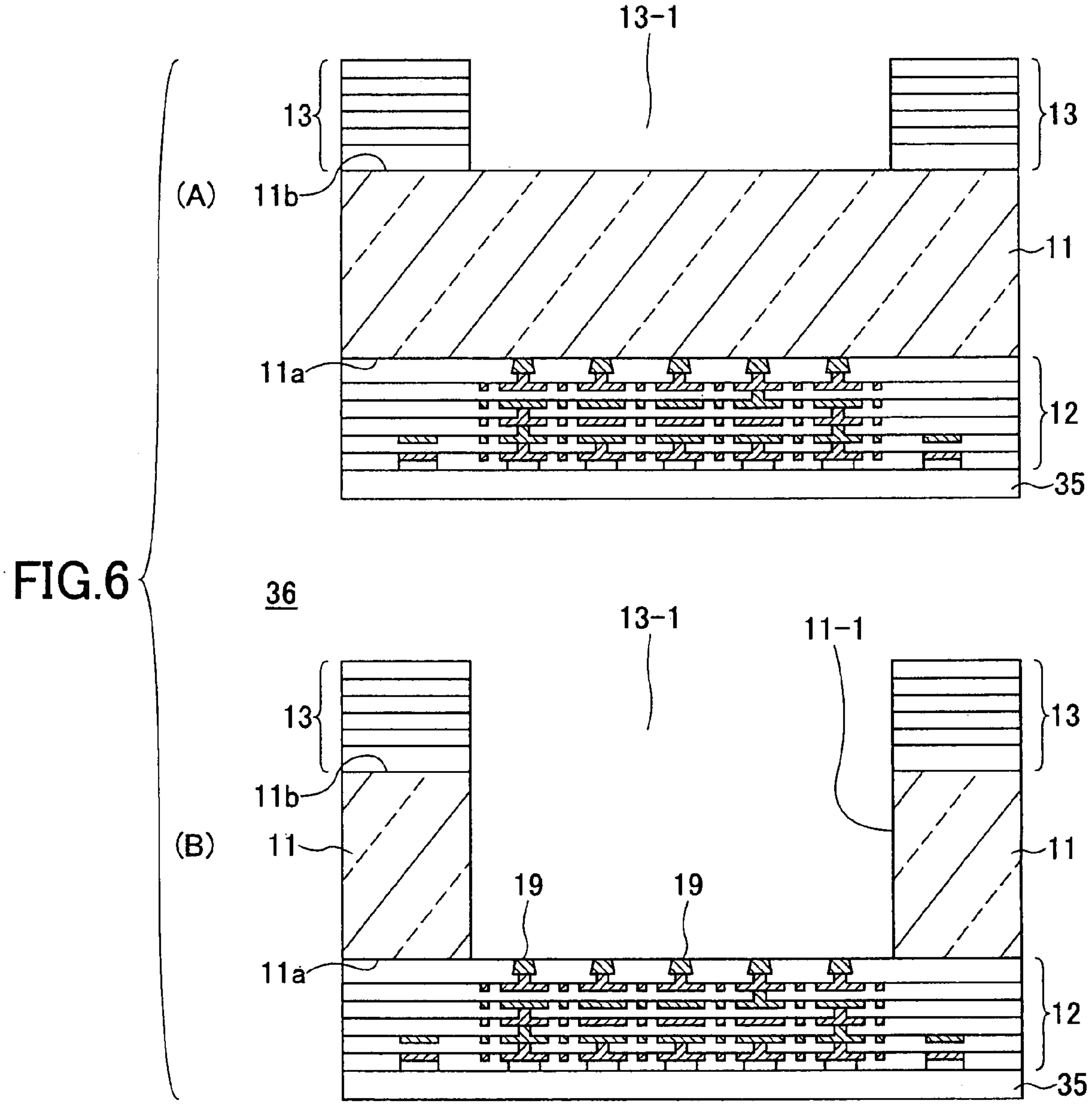
FIG. 6-(A) and FIG. 6-(B) is a third view for manufacturing of the semiconductor device of the first embodiment.

Next, in the process shown in FIG. 6-(A), the opening part 13-1 is formed in the multilayer dielectric layer 13 at the side of the second surface 11*b*. The opening part 13-1 is slightly bigger than the semiconductor chip mounted by the following process. More specifically, the dry film photo resist 35 is stuck on the surface of the multilayer wiring layer 12 so as to be protected. By a mechanical process such as a drill or end mill, the multilayer dielectric layer 13 at the side of the second surface is mechanically ground so that the second surface 11*b* is exposed.

Next, in the process shown in FIG. 6-(B), the opening part 11-1 is formed on the support substrate 11 by chemical etching. The opening part 11-1 connects to the opening part 13-1 of the multilayer dielectric layer 13. More specifically, by using the multilayer dielectric layer 13, in a case where the support substrate 11 is an alloy plate, etching is applied in a thickness direction of the support substrate 11 by using a Ferric Chloride Solution. Etching is stopped in a state where the Au film 32*b* of the stacked body 32 shown in FIG. 4-(A) functions as an etching stopper film. Therefore, in the stacked body 32, the Ni film 32*a* is removed so that the Au film 32*b*/Ni film 32*c*/Cu film 32*d* is made and the pads 19 for connecting are formed. The pads 19 are formed on the surface of the Au film 32*b*. Next, the dry film photo resist 35 is peeled out. Thus, the multilayer stacking substrate 36 where the semiconductor chip can be mounted is formed.

Figure 7:
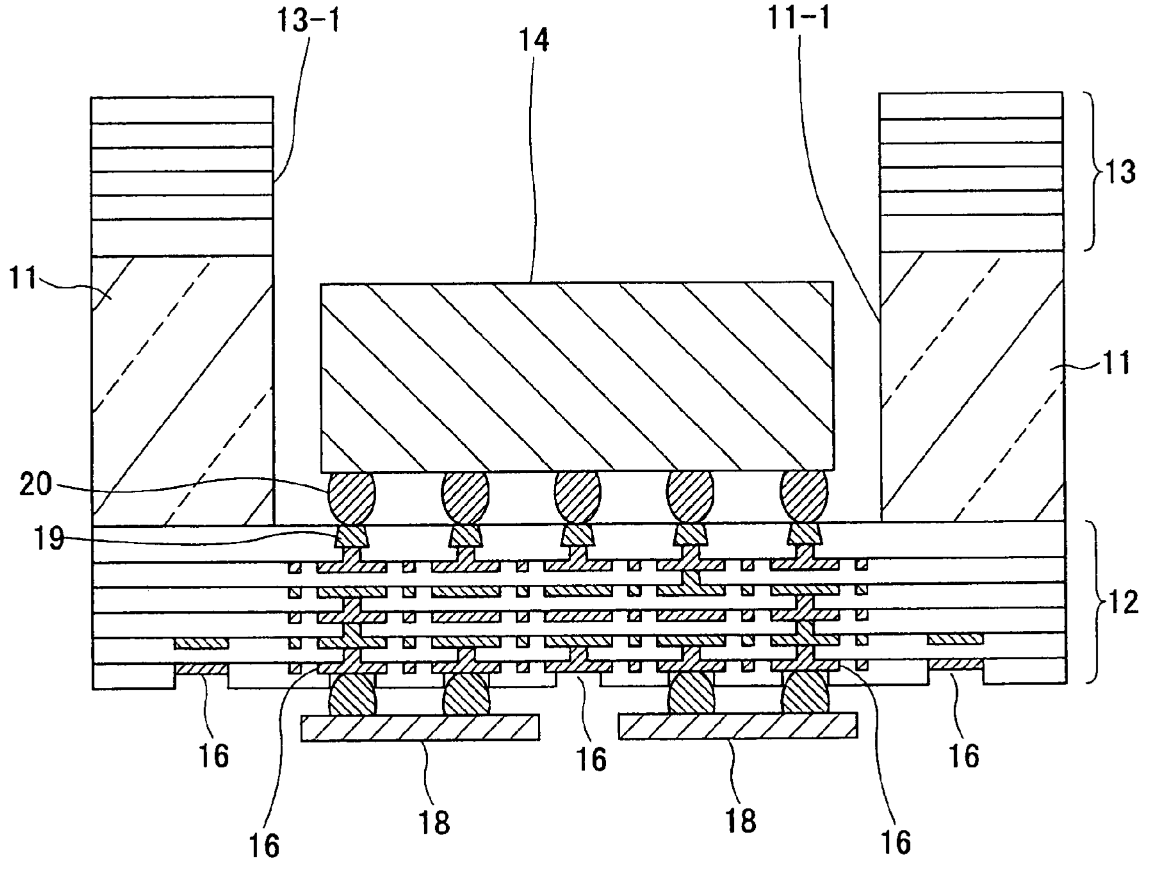
FIG. 7 is a fourth view for manufacturing of the semiconductor device of the first embodiment.

Next, in the process shown in FIG. 7, the semiconductor chip 14 is arranged in the opening part 11-1 by using a semiconductor chip placing machine so that the solder connecting process can be done. The solder connecting process is implemented by reflow solder connection wherein an infrared reflow furnace is used, for example. The solder bumps 20 of the semiconductor chip 14 are fused to the pads 19 of the multilayer wiring layer 12. Positioning of the solder bumps 20 and the pads 19 for connecting is implemented self-formingly. Since the support substrate 11 is put between the multilayer wiring layer 12 and the multilayer dielectric layer 13 having substantially the same materials, it is possible to prevent the generation of the curve of the support substrate 11 based on the thermal expansion difference due to heating so that flatness of the substrate 11 can be maintained. Therefore, it is possible to securely position the solder bumps 20 of the semiconductor chip 14 and the electrodes 19 for connecting. Since the situation of connection between the solder bumps 20 and the electrodes 19 for connection is good, it is possible to solder-connect with high reliability.

After the process shown in FIG. 7, the opening part is filled with material of the resin part 15 such as the epoxy group resin, the semiconductor chip 14 is sealed, and the decoupling capacitors 18 are solder-connected to the electrode pads 16, so that the semiconductor device 10 shown in FIG. 3 is formed.

According to the manufacturing method of this embodiment, in the process of solder connection for mounting the semiconductor chip 14, the support substrate 11 is put between and fixed by the multilayer wiring layer 12 and the multilayer dielectric layer 13. The multilayer wiring layer 12 and the multilayer dielectric layer 13 have substantially same structures. Therefore, it is possible to prevent a strain or curve due to the thermal expansion coefficient difference between the support substrate 11 and the multilayer wiring layer 12 and the multilayer dielectric layer 13. Hence, it is possible to improve reliability of the connection between the semiconductor chip 14 and the electrodes for connection. Particularly, several hundred pads 19 for connection are provided at the wiring layer in the opening part in a matrix shape. Since the multilayer wiring layer 12 has good flatness, it is possible to securely solder-connect the solder bumps 20 corresponding to the electrodes for connection.

Furthermore, according to the manufacturing method of this embodiment, since the opening part 11-1 is formed in the support substrate 11 by chemical etching, it is possible to prevent better generation of damages to the pads 19 for connection compared to mechanical processing. Furthermore, by providing the etching stopper film (Au film 32*b*), it is possible to define an end point of chemical etching.

In the process shown in FIG. 6-(B), the opening part of the support substrate 11 may be formed by using the following process.

Figure 8:
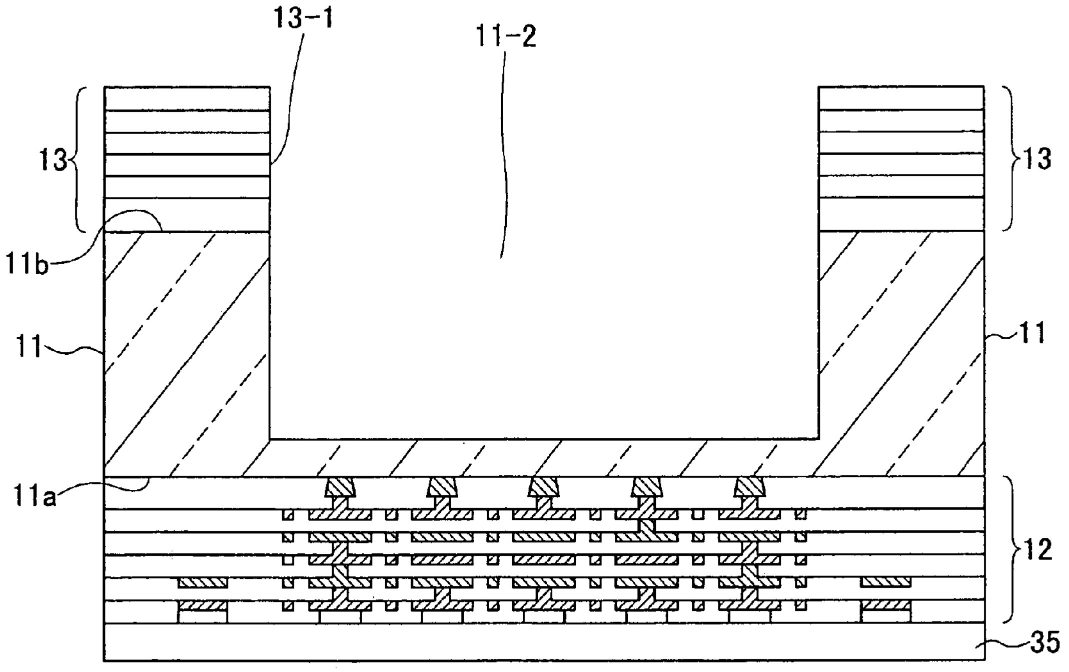
FIG. 8 is a view showing a first modified example of the manufacturing process of the semiconductor device of the first embodiment of the present invention.

FIG. 8 is a view showing a first modified example of the manufacturing process of the semiconductor device of the first embodiment of the present invention. In the process shown in FIG. 8, the opening part 11-2 is formed by mechanical processing such as drilling through the multilayer dielectric layer 13 and continuing so that the support substrate 11 remains a designated thickness such as 1 mm. Next, the chemical etching method is applied as shown in FIG. 6-(B) so that the opening part 11-2 which pierces the support substrate 11 is formed. Since the process other than the process for forming the opening part 11-2 is the same as the manufacturing process as discussed above, the explanation thereof is omitted.

In this example, in a case where the support substrate 11 has a great thickness, the support substrate 11 can be ground to a designated depth by mechanical processing so that time for etching can be shortened and therefore it is possible to improve working efficiency.

Furthermore, the multilayer dielectric layer 13 at a side of the second surface 11*b* of the semiconductor device 10 shown in FIG. 3 may be a multilayer wiring layer as well as the multilayer wiring layer 12 at a side of the first surface 11*a*.

Figure 9:
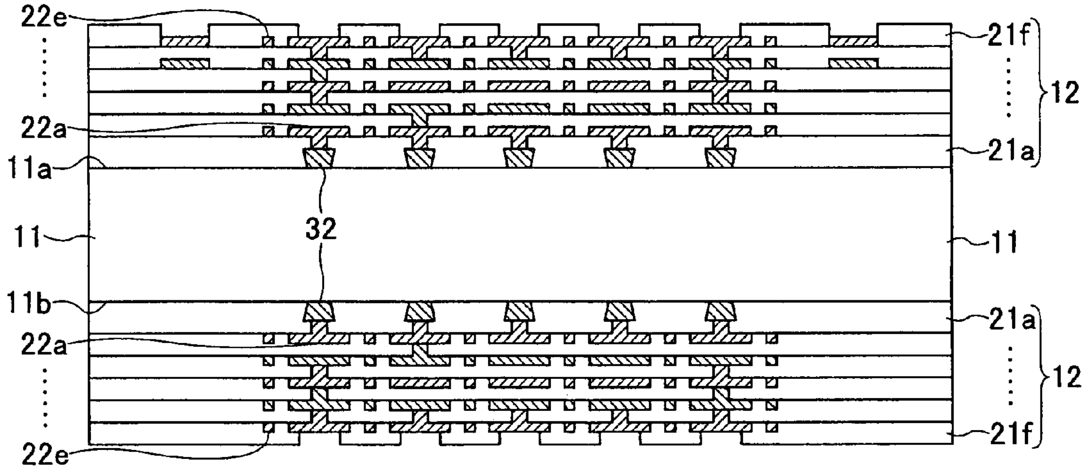
FIG. 9 is a view showing a second modified example of the manufacturing process of the semiconductor device of the first embodiment of the present invention.

FIG. 9 is a view showing a second modified example of the manufacturing process of the semiconductor device of the first embodiment of the present invention. In the process shown in FIG. 9, the wiring layers 22*a* through 22*e* are stacked at a side of the second surface 11*b* of the support substrate 11 as well as a side of the first surface as shown in FIG. 4-(A) through FIG. 5-(C). On each of the surfaces of the support substrate 11, the corresponding one of the multilayer wiring layers 12 is stacked. Hence, even if a strain or an inner stress is generated in the process for forming the multilayer wiring layers 12, the substantially same strains or inner stresses are generated in symmetrical directions against the support substrate 11. Hence, it is possible to further prevent the generation of the strain and the curve.

After the process shown in FIG. 6-(B), a wiring test for determining whether the multilayer wiring layer 12 is correctly wired may be done. It is possible to prevent useless mounting of the semiconductor chip 14 by removing a bad multilayer wiring layer 12 before the semiconductor chip 14 is mounted.

Second Embodiment

Figure 10:
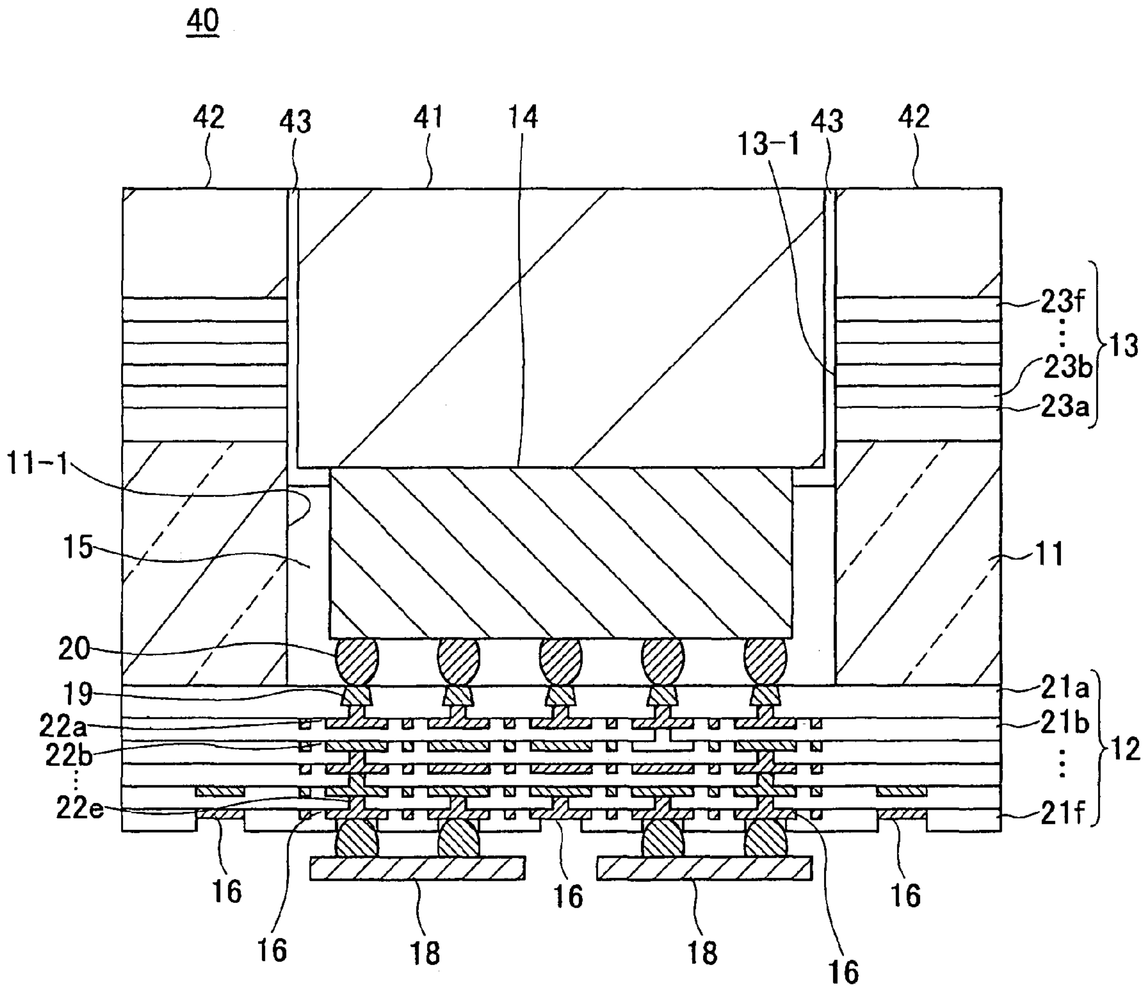
FIG. 10 is a schematic cross-sectional view of a semiconductor device of a second embodiment of the present invention.

FIG. 10 is a schematic cross-sectional view of a semiconductor device of a second embodiment of the present invention. In the second embodiment, parts that correspond to the parts discussed in the first embodiment are given the same reference numerals in FIG. 10, and explanation thereof is omitted.

Referring to FIG. 10, a semiconductor device 40 of the second embodiment is the same as the semiconductor device of the first embodiment other than that the semiconductor device 40 includes a heat sink 41 and a stiffener 42. The heat sink 41 is provided on the semiconductor chip 14. The stiffener 42 is provided on the surface of the multilayer dielectric layer 13 so as to surround the opening part 13-1.

The heat sink 41 is made of, for example, Al, Al alloy, Cu, Cu alloy or the like having a plate configuration which has a thickness of 2 mm or a fin configuration. A high heat-conduction compound including an inorganic filler such as alumina may be applied on a contact surface of the heat sink 41 and the semiconductor chip 14 in order to reduce the heat transfer resistance.

The stiffener 42 is made of material the same as the support substrate 11 having a thickness of 1 mm. The stiffener 42 has a plate configuration or a frame configuration having an opening part substantially the same as the opening part 13-1. The stiffener 42 prevents deformation of the semiconductor device 40 due to an internal stress and an external stress so as to hold better flatness of the semiconductor device 40.

The resin part 15, as in the first embodiment, is formed in a space between the opening part 11-1 and the semiconductor chip 14. The resin part 15, namely an under-fill part, may be formed between the solder bumps 20 and the opening part 11-1. Furthermore, a resin part 43 that is substantially the same as the resin material of the resin part 15, is formed in a space between the heat sink 41 and the side of the opening part 13-1.

The manufacturing method of the semiconductor device of the second embodiment is omitted. First, the processes shown in FIG. 4 through FIG. 7 in the first embodiment are implemented. Then, the resin part 15 is formed by filling in the opening part 11-1 with the resin so that the resin part 15 is lower than the upper surface of the semiconductor chip 14. Next, the heat sink 41 is provided or stuck on the upper surface of the semiconductor chip 14. Then the stiffener 42 is adhered on the surface of the multilayer dielectric layer 13.

After that, the resin part 43 is formed by filling in the space of the opening part 13-1 with the resin substantially the same as the material of the resin part 15 so that the semiconductor chip 14 is sealed. Thus, the semiconductor device 40 of this embodiment is formed.

The present invention is not limited to these embodiments, but variations and modifications may be made without departing from the scope of the present invention. For example, in the first or second embodiment, the wiring layer which actually functions as wiring may be provided at the multilayer dielectric layer 13 of the semiconductor device 10 or 40 shown in FIG. 3 or FIG. 10 and a piercing electrode may be formed at a support substrate so that the wiring layer may be connected to the wiring of the multilayer wiring layer 12.

What is claimed is:

1. A manufacturing method of a semiconductor device, comprising:

a) forming a multi-layer wiring on a first surface of a support body;

b) forming a multi-layer dielectric on a second surface of the support body, wherein the second surface is situated at a side opposite to the first surface;

c) forming a first opening part exposing the second surface of the support body by piercing the multi-layer dielectric;

d) forming a second opening part connecting to the first opening part and piercing the support body by using the pierced multi-layer dielectric as mask; and e) solder-connecting a semiconductor chip to a top surface of the multi-layer wiring in the second opening part;

wherein the step e) includes the processes of f) forming a pad for connecting to the semiconductor chip on the first surface of the support body;

g) forming a first dielectric layer covering the pad and then on the first dielectric layer reciprocally stacking a wiring layer and a dielectric layer in an alternating manner to form the multi-layer wiring on the first surface of the support body; and h) forming an electrode pad at a bottom surface of the multi-layer wiring; and wherein the step b) includes a process of i) stacking a plurality of second dielectric layers on the second surface of the support body to form the multi-layer dielectric.

2. The manufacturing method of a semiconductor device as claimed in claim 1, wherein the step d) includes performing a wet etching to form the second opening.

3. The manufacturing method of a semiconductor device as claimed in claim 1, further comprising forming the pad by forming an etching stopper film for wet-etching at the first surface of the support body and using the etching stopper film to define an etching end point in forming the second opening part in the step d).

4. The manufacturing method of a semiconductor device as claimed in claim 1, further comprising mechanically grounding a part of the support body and then performing a wet etching to form the second opening part in the step d).

5. The manufacturing method of a semiconductor device as claimed in claim 1, wherein, in the forming of the multi-layer wiring and the multi-layer dielectric, simultaneously forming the first and second dielectric layers, and wherein the first dielectric layers is a part of the multi-layer wiring and the corresponding second dielectric layer is a part of the multi-layer dielectric.

6. The manufacturing method of a semiconductor device as claimed in claim 1, further comprising reciprocally stacking each of the second dielectric layers and another wiring layer, made of a material substantially same as the wiring layer of the multi-layer wiring, over the second surface of the support body, in the step b).

7. The manufacturing method of a semiconductor device as claimed in claim 6, wherein, in the forming of the multi-layer wiring and the multi-layer dielectric, simultaneously forming the dielectric layer of the multi-layer wiring and the dielectric layer of the multi layer dielectric.

* * * * *